[12] United States Patent
Hyun et al.

(10) Patent No.: US 9,832,914 B2
(45) Date of Patent: Nov. 28, 2017

(54) STRUCTURE FOR SHIELDING ELECTRONOMAGNETIC WAVES

(71) Applicant: LG INNOTEK CO., LTD., Seoul (KR)

(72) Inventors: Soon Young Hyun, Seoul (KR); Seok Bae, Seoul (KR); Hyung Yoon, Seoul (KR); Yong Jae Kwon, Seoul (KR); Hyung Eui Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/010,618

(22) Filed: Jan. 29, 2016

(65) Prior Publication Data
US 2016/0227680 A1  Aug. 4, 2016

(30) Foreign Application Priority Data

Jan. 29, 2015 (KR) .................. 10-2015-0014374

(51) Int. Cl.
H05K 9/00 (2006.01)
C25D 5/12 (2006.01)
C23C 18/16 (2006.01)
C23C 18/38 (2006.01)

(52) U.S. Cl.
CPC ....... *H05K 9/0024* (2013.01); *C23C 18/1653* (2013.01); *C23C 18/38* (2013.01); *C25D 5/12* (2013.01); *H05K 9/003* (2013.01); *H05K 9/0045* (2013.01)

(58) Field of Classification Search
CPC .... H05K 9/0024; H05K 9/003; H05K 9/0045; C23C 18/18

USPC ........................................................ 174/377
See application file for complete search history.

(56) References Cited

U.S. PATENT DOCUMENTS

| | | | | |
|---|---|---|---|---|
| 4,542,076 A * | 9/1985 | Bednarz | ............. | B29C 61/0616 174/388 |
| 5,180,639 A * | 1/1993 | Zarnoch | ..................... | C08J 7/12 205/167 |
| 5,372,886 A * | 12/1994 | Inazawa | ................. | H01B 3/105 174/110 A |
| 6,207,266 B1 * | 3/2001 | Kanbara | ............... | H01J 29/868 174/389 |
| 6,228,465 B1 * | 5/2001 | Takiguchi | ............ | H05K 3/0044 174/250 |

(Continued)

FOREIGN PATENT DOCUMENTS

| | | |
|---|---|---|
| JP | 2000-212759 | 8/2000 |
| JP | 2000212759 A * | 8/2000 |
| WO | WO 2004/114731 | 12/2004 |

OTHER PUBLICATIONS

European Search Report dated Jun. 21, 2016 issued in Application No. 16153177.7.

*Primary Examiner* — William H Mayo, III
*Assistant Examiner* — Rhadames J Alonzo Miller
(74) *Attorney, Agent, or Firm* — Ked & Associates, LLP

(57) ABSTRACT

A structure and a device may include an electromagnetic wave generator configured to generate electromagnetic waves; a shielding structure configured to surround at least a portion of the electromagnetic wave generator; and a metal layer provided on inner surfaces of upper and side portions of the shielding structure, wherein the metal layer having a predetermined surface roughness.

14 Claims, 7 Drawing Sheets

(56) References Cited

U.S. PATENT DOCUMENTS

| | | | | |
|---|---|---|---|---|
| 6,291,081 B1* | 9/2001 | Kurabe | C25D 1/04 | 174/257 |
| 7,314,650 B1* | 1/2008 | Nanis | C23C 14/3407 | 204/192.1 |
| 8,062,930 B1* | 11/2011 | Shah | C23C 4/06 | 438/110 |
| 2003/0121697 A1* | 7/2003 | Nagai | H05K 1/09 | 174/259 |
| 2005/0022692 A1* | 2/2005 | Eu | C08F 290/06 | 106/1.11 |
| 2005/0067963 A1* | 3/2005 | Kim | H05K 7/20963 | 313/583 |
| 2006/0272856 A1* | 12/2006 | Arnold | H05K 9/0024 | 174/377 |
| 2006/0272857 A1* | 12/2006 | Arnold | H05K 9/0024 | 174/377 |
| 2007/0030661 A1* | 2/2007 | Morris | C23C 30/00 | 361/818 |
| 2007/0059901 A1* | 3/2007 | Majumdar | H01L 51/0013 | 438/455 |
| 2009/0092762 A1* | 4/2009 | Soong | C23C 4/131 | 427/446 |
| 2009/0151984 A1* | 6/2009 | Fujimura | C08J 5/24 | 174/250 |
| 2009/0256244 A1* | 10/2009 | Liao | H01L 21/568 | 257/660 |
| 2010/0120962 A1* | 5/2010 | Yoshida | C23C 18/2006 | 524/428 |
| 2011/0115060 A1* | 5/2011 | Chiu | H01L 21/568 | 257/660 |
| 2011/0232821 A1* | 9/2011 | Saukaitis | B01D 53/228 | 156/60 |
| 2011/0260301 A1* | 10/2011 | Liao | H01L 21/568 | 257/659 |
| 2012/0067871 A1* | 3/2012 | Sherrer | C23C 24/082 | 219/678 |
| 2013/0199830 A1* | 8/2013 | Morita | C08L 63/00 | 174/258 |
| 2013/0220696 A1* | 8/2013 | Otani | H01G 4/12 | 174/534 |
| 2014/0027171 A1* | 1/2014 | Song | H05K 9/0024 | 174/377 |
| 2014/0034369 A1* | 2/2014 | Hasegawa | H05K 1/02 | 174/255 |
| 2014/0160699 A1* | 6/2014 | Zhang | H01L 23/552 | 361/752 |
| 2014/0247559 A1* | 9/2014 | Wu | H05K 7/20509 | 361/704 |
| 2014/0293570 A1* | 10/2014 | Patino | H05K 9/0028 | 361/818 |
| 2015/0043172 A1* | 2/2015 | Mugiya | H05K 1/0218 | 361/728 |
| 2015/0124417 A1* | 5/2015 | Nakao | H05K 3/284 | 361/761 |
| 2015/0201533 A1* | 7/2015 | Daughtry, Jr. | H05K 9/0024 | 174/377 |
| 2015/0216032 A1* | 7/2015 | Lee | H05K 1/0216 | 361/760 |
| 2015/0271959 A1* | 9/2015 | Chen | H05K 9/0024 | 361/760 |
| 2015/0282392 A1* | 10/2015 | Liu | H05K 9/0024 | 361/707 |

\* cited by examiner

FIG. 5A

| UPPER PORTION (SURFACE ROUGHNESS um) | Blister,Chipping OCCURRENCE | AREA OF VOID TO TOTAL AREA [%] | Adhesion strength [gf/cm] |
|---|---|---|---|
| 0.1 | BLISTER OCCURS BLISTER | 72.2 | 87.4 |
| 0.5 | BLISTER OCCURS BLISTER | 56.1 | 98.3 |
| 0.7 | BLISTER OCCURS BLISTER | 42.1 | 102.3 |
| 1.0 | NO BLISTER OCCURS | 0 | 201.5 |
| 3.0 | NO BLISTER OCCURS | 0 | 203.5 |
| 5.0 | NO BLISTER OCCURS | 0 | 209.3 |
| 7.0 | NO BLISTER OCCURS | 0 | 211.5 |
| 7.5 | NO BLISTER OCCURS | 0 | 212.4 |
| 7.6 | BLISTER OCCURS BLISTER | 56.3 | 185.3 |

FIG. 5B

| SIDE PORTION (SURFACE ROUGHNESS um) | Blister,Chipping OCCURRENCE | AREA OF VOID TO TOTAL AREA [%] | Adhesion strength [gf/cm] |
|---|---|---|---|
| 0.05 | NO CHIPPING OCCURS | 0 | 211.2 |
| 0.1 | NO CHIPPING OCCURS | 0 | 209.3 |
| 0.5 | NO CHIPPING OCCURS | 0 | 208.4 |
| 1.0 | NO CHIPPING OCCURS | 0 | 212.2 |
| 1.5 | NO CHIPPING OCCURS | 0 | 215.8 |
| 2.0 | NO CHIPPING OCCURS | 0 | 231.4 |
| 2.5 | NO CHIPPING OCCURS | 0 | 213.4 |
| 3.0 | NO CHIPPING OCCURS | 0 | 211.6 |
| 3.5 | NO CHIPPING OCCURS | 0 | 221.9 |
| 3.6 | CHIPPING OCCURS | 32.3 | 123.3 |

FIG. 5C

| UPPER PORTION (SURFACE ROUGHNESS um) | SIDE PORTION (SURFACE ROUGHNESS um) | SHIELDING RATE WHEN PLATING LOW FREQUENCY SHIELDING RATE (30M~1GHz) | SHIELDING RATE WHEN PLATING HIGH FREQUENCY SHIELDING RATE (1GHz~10GHz) |
|---|---|---|---|
| 1.0 | 0.05 | 56.1 | 17.3 |
| 1.0 | 0.1 | 70.2 | 29.3 |
| 1.0 | 1.0 | 71.1 | 29.4 |
| 1.0 | 2.0 | 71.3 | 29.1 |
| 1.0 | 3.0 | 71.2 | 29.1 |
| 1.0 | 3.5 | 62.1 | 17.3 |
| 5.0 | 0.05 | 60.2 | 21.9 |
| 5.0 | 0.1 | 72.1 | 28.3 |
| 5.0 | 1.0 | 75.3 | 29.1 |
| 5.0 | 2.0 | 73.2 | 29.9 |
| 5.0 | 3.0 | 75.4 | 29.3 |
| 5.0 | 3.5 | 54.3 | 26.2 |
| 7.0 | 0.05 | 59.4 | 20.2 |
| 7.0 | 0.1 | 74.3 | 29.2 |
| 7.0 | 1.0 | 75.4 | 29.1 |
| 7.0 | 2.0 | 74.3 | 32.3 |
| 7.0 | 3.0 | 75.2 | 33.4 |
| 7.0 | 3.5 | 63.3 | 25.4 |
| 7.5 | 0.05 | 60.2 | 24.3 |
| 7.5 | 0.1 | 64.3 | 24.8 |
| 7.5 | 1.0 | 61.2 | 27.3 |
| 7.5 | 2.0 | 62.7 | 27.1 |
| 7.5 | 3.0 | 63.5 | 26.2 |
| 7.5 | 3.5 | 63.2 | 27.2 |

STRUCTURE FOR SHIELDING ELECTRONOMAGNETIC WAVES

CROSS-REFERENCE TO RELATED APPLICATION

This application claims priority under 35 U.S.C. §119 to Korean Patent Application No. 2015-0014374, filed on Jan. 29, 2016, whose entire disclosure is incorporated herein by reference.

BACKGROUND

1. Field

Embodiments relate to a structure capable of efficiently shielding electromagnetic waves.

2. Background

Recently, as components are integrated in an electronic product and processing speeds are accelerated, performance for each component may be maximized. However, malfunctions, performance degradation, and deterioration caused by electromagnetic interference between adjacent components may be generated. Thus, shielding of electromagnetic interference (EMI) may be implemented, for example, using a metal member, to prevent electromagnetic interference between adjacent electronic components and improve performance.

In using the metal member for shielding of EMI, there may be problems associated with whether a device or an object should be widely covered, whether an adjacent device and a device not related to corresponding performance should be also covered, and whether characteristics, such as, e.g., height or material thickness, of the metal member should be considered, depending on the electronic components. As it may be difficult for the shielding of EMI to be performed completely, EMI leakage may frequently occur on a surface of a printed circuit board, at which an electronic component may be mounted and at a portion to which the above-described metal member may be coupled.

BRIEF DESCRIPTION OF THE DRAWINGS

The embodiments will be described in detail with reference to the following drawings in which like reference numerals refer to like elements wherein:

FIGS. 5A to 5C are result tables based on a range of the surface roughness of inner surfaces of upper and side portions of the shielding structure according to an embodiment;

DETAILED DESCRIPTION

Figure 1:
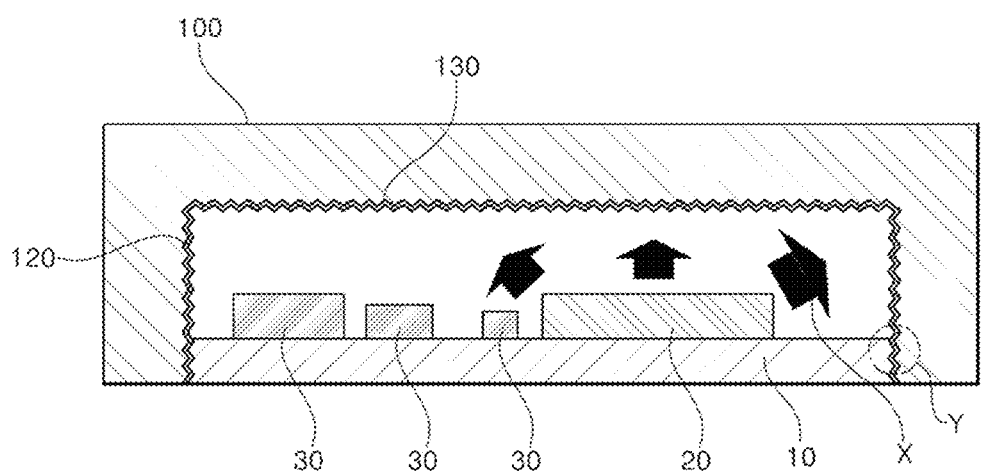
FIG. 1 is a conceptual view of a package to which a structure for shielding electromagnetic waves is applied according to an embodiment.
Figure 2:
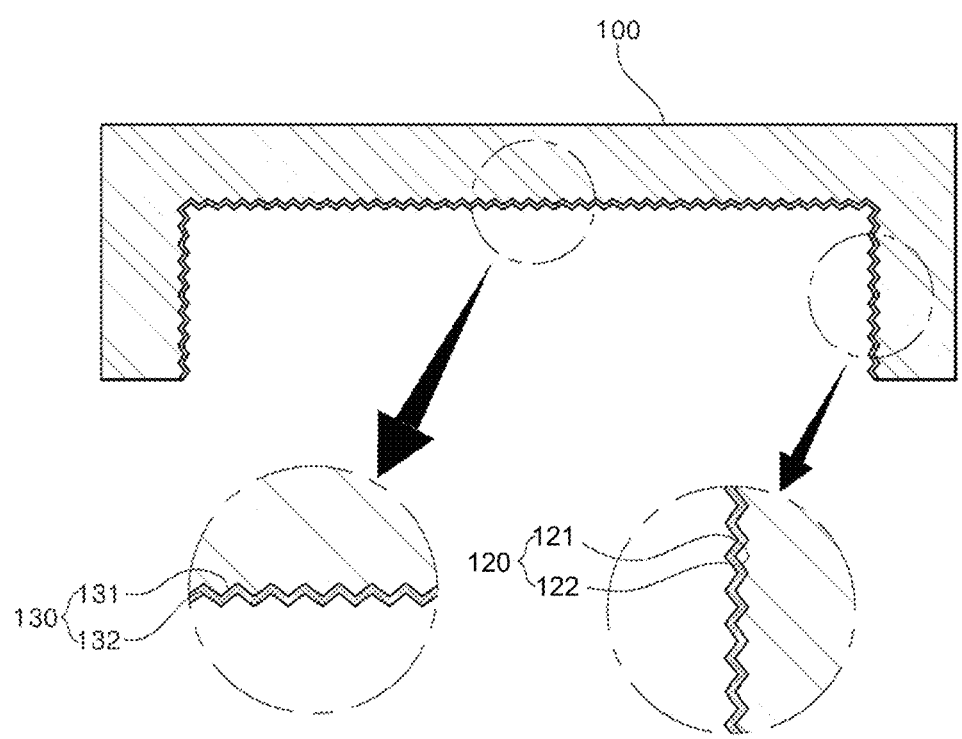
FIG. 2 is an enlarged conceptual view of the structure for shielding electromagnetic waves of FIG. 1.

FIG. 1 is a conceptual view of a package to which a structure for shielding electromagnetic waves is applied according to an embodiment. FIG. 2 is an enlarged conceptual view of the structure for shielding electromagnetic waves of FIG. 1. Referring to FIGS. 1 and 2, a structure for shielding electromagnetic waves may include an electromagnetic wave generating source 20 that generates electromagnetic waves X, a shielding structure 100 arranged to surround the electromagnetic wave generating source or generator 20, and metal layers 120 and 130 for shielding electromagnetic waves having surface roughness on an inner surface 121 of a side portion of the shielding structure 100 and an inner surface 131 of an upper portion of the shielding structure 100, respectively. The inner surfaces 121, 131 of the shielding structure 100 may be surfaces that may face the electromagnetic wave generating source. The metal layers 120, 130 may include respective surfaces 122, 132, which may face or be exposed to the electromagnetic waves, at the side portion and the upper portion of the shielding structure 100.

The metal layers 120 and 130 for shielding electromagnetic waves may be surface-treated by physical or chemical processing on the inner surface 121, 131 of the shielding structure 100. The metal layers 120 and 130 for shielding electromagnetic waves may prevent a discordance or incompatibility of coefficients of thermal expansion (CTE) between materials, which may be generated due to natures of different materials between a surface of the shielding structure and a metal layer, and may prevent poor adhesion, which may be generated due to a difference of surface energy in forming metal layers on the surface-treated surface, for example, in a plating method. The metal layers 120 and 130 for shielding electromagnetic waves may prevent a blister phenomenon and a side slipping phenomenon by ensuring a surface area that provides sufficient anchoring energy. A film may be uniformly formed, even on a side portion, to prevent electromagnetic interference (EMI) leakage generated from the side portion of the shielding structure, and thus, shielding performance may be increased.

As shown in FIG. 1, the shielding structure 100 according to the embodiment may entirely cover and surround an electronic component or an electronic device, which may be the electromagnetic wave generating source 20. The electromagnetic wave generating source 20 may be mounted on a substrate, such as, for example, a printed circuit board 10. One or more electronic components 30, which may not generate electromagnetic waves, may be mounted on the printed circuit board 10. The shielding structure 100 may be in close contact with the printed circuit board 10, and the metal layer 120, 130 for shielding electromagnetic waves according to the embodiment may be implemented or provided at a contact portion Y between the shielding structure 100 and the printed circuit board 10, thereby blocking EMI leakage on a contact surface or a coupled surface.

For example, the shielding structure 100 may be physically processed or chemical processed to have a surface roughness, which may be uniform, therein. When a thin metal layer is formed on the inner surface of the shielding structure 100 having the surface roughness from, for example, a plating process, the metal layer may be also formed to have a surface roughness. The surface roughness formed on the inner surface of the shielding structure 100 may be formed so that a surface roughness of the upper portion of the shielding structure 100 and a surface roughness of the side portion thereof may be the same, but may also be formed so that the surface roughness of the upper portion of the shielding structure and the surface roughness of the side portion thereof may be different from each other, depending on a degree of influence of electromagnetic waves.

The surface roughness (Ra) of the upper portion of the shielding structure may be in a range of 1 to 7.5 µm, and the surface roughness of the side portion of the shielding structure may be in a range of 0.05 to 3.5 µm. When the surface roughness is out of these ranges, a blister phenomenon, or blistering, between the metal layer and a surface of the shielding structure or a chipping phenomenon, or a local scratch, at an interface may occur, and occurrences of the blister phenomenon and the chipping phenomenon may be increased.

Further, the surface roughness in the shielding structure may be implemented, as described above, by a method in which the surface roughness may be naturally transferred to the metal layer through performing a surface treatment, for example, through physical and chemical processing, on the inner surface of the shielding structure and then forming a metal layer. Alternatively, when the metal layer is formed on the inner surface of the shielding structure, a surface roughness processing may be performed by patterning the metal layer.

Figure 3:
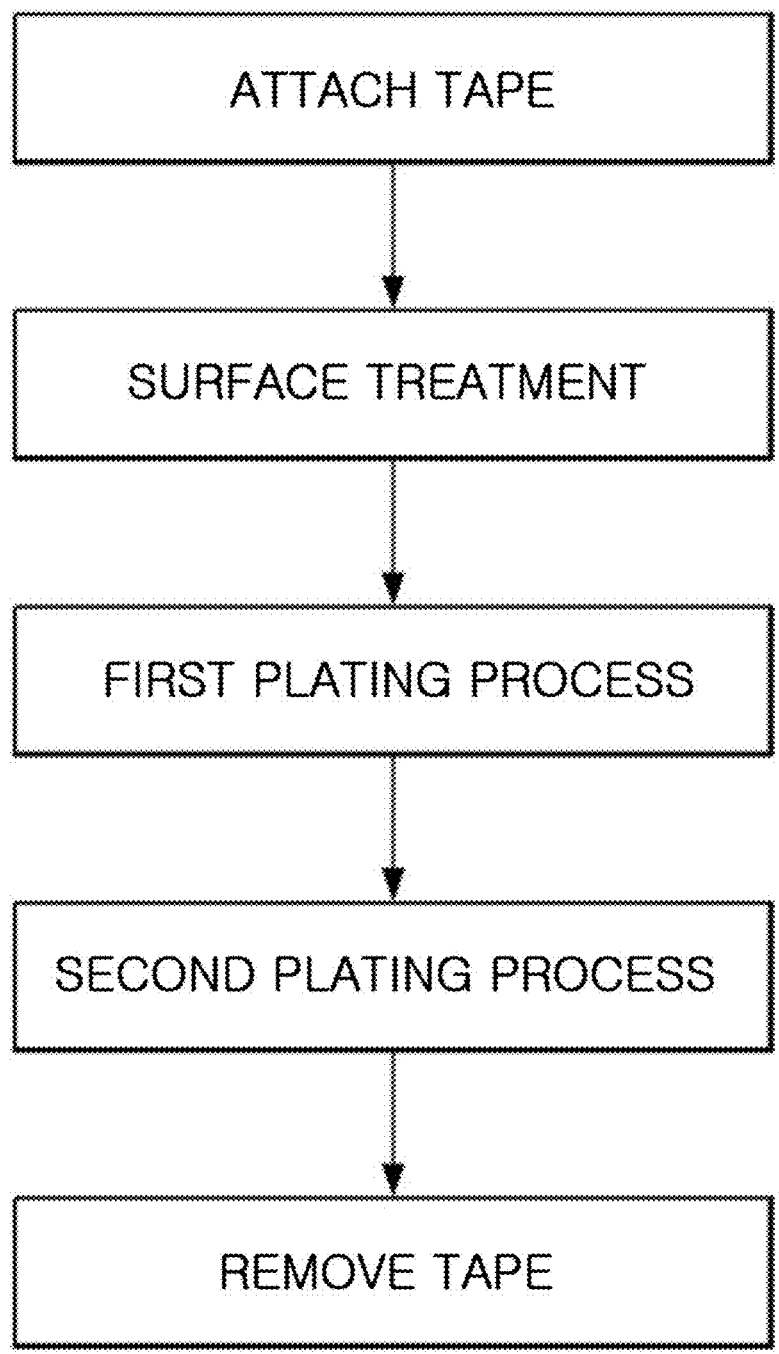
FIG. 3 is a flowchart illustrating a surface treatment process of a shielding structure according to an embodiment.

FIG. 3 is a flowchart illustrating a surface treatment process of the shielding structure according to the embodiment. Referring to FIG. 3, to form a metal layer for shielding electromagnetic waves with surface roughness on the shielding structure according to the embodiment, a foam type tape may be attached to the inner surface of the shielding structure 100, and an area, in which the surface roughness may be implemented or provided, may be formed. Then, a surface treatment process is performed to implement or provide the surface roughness on the inner surface of the shielding structure 100. The surface treatment process may be performed, for example, using a chemical surface treatment or a physical surface treatment method.

The chemical surface treatment method may include, for example, a swelling method using glycol ether, an etching method using an etching solution, such as, e.g., $KMnO_4$, or a neutralization method using acid liquid, such as, e.g., sulfuric acid. The physical surface treatment may include a method in which the surface roughness may be implemented or provided, for example, using an electron beam (E-Beam) laser, an ultra violet (UV) laser, or $CO_2$ laser. For example, when a processing is performed under conditions in which electron energy is 30 keV, an E-Beam diameter is 30 to 50 µm, and an application time is 10 to 20 minutes, a surface roughness as shown in FIGS. 4A and 4B may be achieved.

Figure 4A:
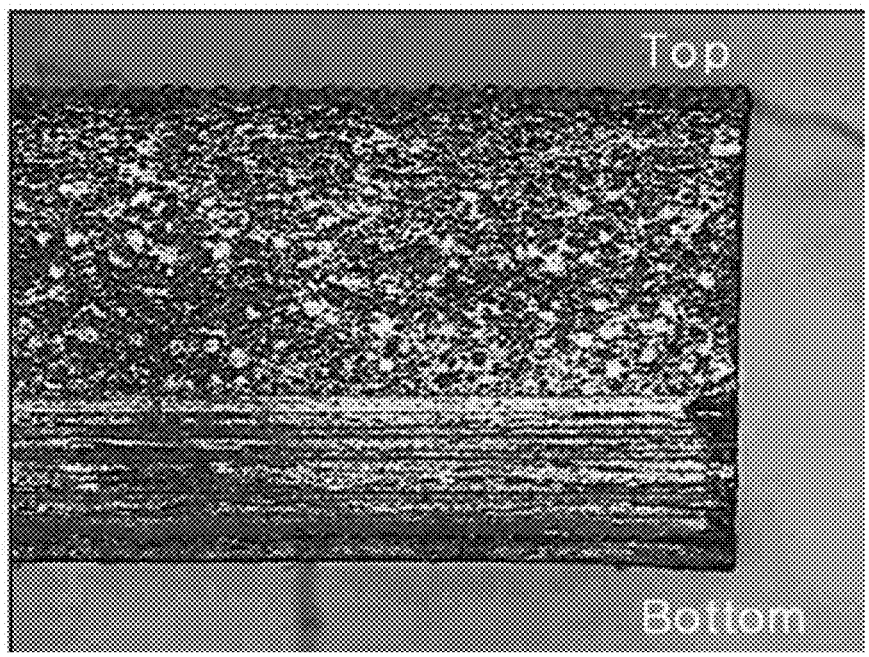
FIG. 4A is an enlarged image of a right inner surface of the shielding structure.
Figure 4B:
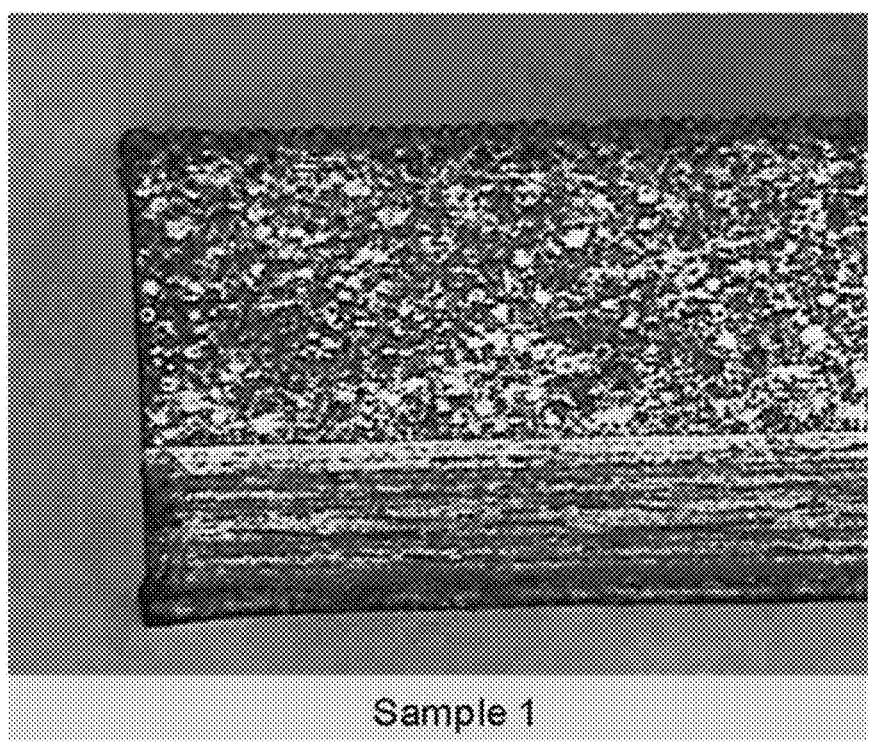
FIG. 4B is an enlarged image of a left inner surface of the shielding structure according to an embodiment.

FIG. 4A is an enlarged image of a right inner surface of the shielding structure of the embodiment, and the FIG. 4B is an enlarged image of a left inner surface of the shielding structure of the embodiment. Even in FIGS. 4A and 4B, as described above, the surface roughness (Ra) of the inner surface of the upper portion of the shielding structure may be in a range of 1 to 7.5 µm and the surface roughness (Ra) of the inner surface of the side portion thereof may be in a range of 0.05 to 3.5 µm. To increase efficiency, the surface roughness (Ra) of the inner surface of the upper portion may be in a range of 1 to 7.0 µm and the surface roughness (Ra) of the inner surface of the side portion thereof may be in a range of 0.1 to 3.0 µm. When the surface roughness is out of the above-described ranges, a defect rate caused by the blister phenomenon may be increased.

FIGS. 5A to 5C are result tables based on a range of the surface roughness of inner surfaces of upper and side portions of the shielding structure according to the embodiment. FIGS. 5A and 5B show whether a blister phenomenon or a chipping phenomenon occurs or not depending on the range of the surface roughness. FIG. 5A shows results of experimental occurrences of the blister phenomenon and results of adhesion strengths with respect to the surface roughness of the inner surface of the upper portion of the shielding structure according to the embodiment. The inner surface of the upper portion of the shielding structure may correspond to an area directly influenced by electromagnetic waves. Referring to FIG. 5A, when the surface roughness is less than 1.0 µm, the blister phenomenon occurs, an area of a void to total area is increased, and a relative adhesion strength is reduced. In FIG. 5A, when the surface roughness of the inner surface of the upper portion of the shielding structure is greater than 7.5 µm, the blister phenomenon occurs again and adhesion strength is reduced. That is, in the inner surface of the upper portion of the shielding structure, when the surface roughness (Ra) satisfies a range of 1 to 7.5 µm, the blister phenomenon does not occur, and adhesion strength of the inner surface is in a range of 201.5 to 212.4 gf/cm, and thus, high reliability of adhesion may be possible.

FIG. 5A shows results of experimental occurrences of the blister phenomenon and results of adhesion strengths with respect to the surface roughness of the side portion of the shielding structure according to the embodiment. Referring to FIG. 5B, when the surface roughness of the side portion of the shielding structure is in a range of 0.05 to 3.5 µm, the blister phenomenon or chipping phenomenon does not occur, and adhesion strength is in a range of 208.4 to 231.4 gf/cm. In FIG. 5B, when the surface roughness is out of these ranges, the blister phenomenon or chipping phenomenon occurs, and adhesion strength is reduced to 123.3 gf/cm. When the surface roughness is less than 0.05 µm, the surface roughness may have such little effect as to be hardly shown.

FIG. 5C shows a comparison between results in which a high frequency shielding rate and a low frequency shielding rate are measured based on a combination of the surface roughness of the inner surfaces of the upper and side portions within the ranges of surface roughness in FIGS. 5A and 5B. As shown in FIG. 5C, when the surface roughness of the inner surface of the upper portion of the shielding structure according to the embodiment in a range of 1.0 to 7.0 µm and the surface roughness of the inner surface of the side portion thereof in a range of 0.1 to 3.0 µm are combined, respective low frequency shielding rates and high frequency shielding rates may be high. Referring to FIGS. 5A and 5B, when the surface roughness of the inner surface of the upper portion is in a range of 7.0 to 7.5 µm, blister phenomenon prevention efficiency and/or adhesion reliability may be high, but when the surface roughness of the inner surface of the side portion is changed from 0.05 to 0.1 µm or from 3.0 to 3.5 µm, some losses of or reduction in the low frequency and high frequency shielding rates may occur.

Therefore, the surface roughness (Ra) of the inner surface of the upper portion of the shielding structure according to the embodiment may be in a range of 1 to 7.5 µm and the surface roughness (Ra) of the inner surface of the side portion may be in a range of 0.05 to 3.5 µm. To further increase the efficiency, the surface roughness (Ra) of the inner surface of the upper portion may be in a range of 1 to 7.0 µm and the surface roughness (Ra) of the inner surface of the side portion may be in a range of 0.1 to 3.0 µm.

After forming the surface roughness, the metal layer may be formed through a first plating process. Thus, the metal layer may have a first metal layer, for example, a Cu metal layer, formed through electroless plating. The Cu metal layer may have improved adhesion to a surface due to the surface roughness of the inner surface of the shielding structure and may be formed to have a uniform surface roughness. Then, at least two layers may be laminated on the first metal layer through a second plating process. For example, the metal layer may be implemented or provided as a structure in which a metal layer of Cu and a metal layer of Ni may be laminated on the first metal layer using an electroplating method. Subsequently, the foam type tape may be removed. When the foam type tape is removed, a burr generated at an interface of the contacted metal layer may be reduced.

In the above-described process, a thickness of the metal layer for shielding electromagnetic waves according to the embodiment may be in a range of 0.1 to 15 μm. When the thickness of the metal layer is in a range of 12 μm or less, shielding efficiency or a shielding rate measured may be increased by approximately 250% compared to a shielding rate measured when the metal layer does not exist.

Figure 6:
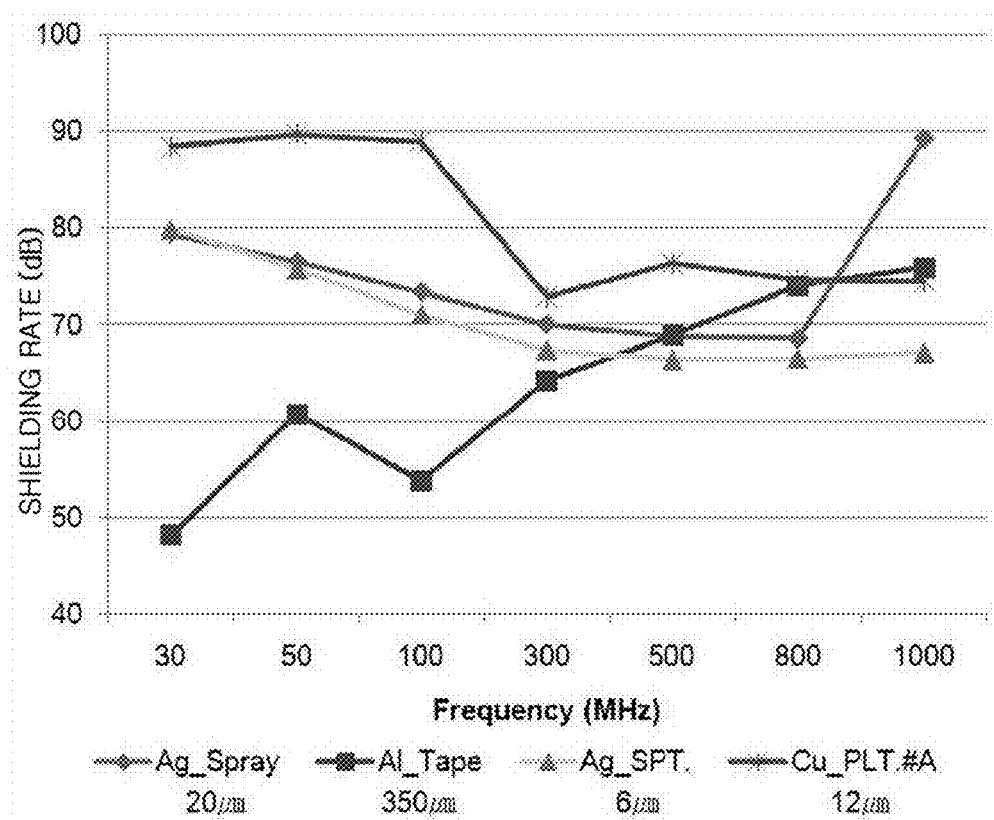
FIG. 6 is a graph of shielding efficiency based on a thickness of a metal layer for shielding electromagnetic waves in an embodiment.

FIG. 6 shows experimental results of electromagnetic wave shielding efficiency in a low frequency band of 30 MHz to 1 GHz when the metal layer for shielding electromagnetic waves according to the embodiment is formed with an electroless Cu-plated layer with a thickness of 12 μm, the surface roughness of the upper portion of the shielding structure is in a range of 1.0 to 7.0 μm, for example, at an average of 5 μm, and the surface roughness of the side portion thereof is in a range of 0.1 to 3.0 μm, for example, at an average of 2 μm. As shown in FIG. 6, an Ag metal layer with a thickness of 20 μm through a spray process, an Al tape with a thickness of 350 μm, and Ag with a thickness of 6 μm through a silver plating (SPT) are used as comparative examples. In the frequency band shown in FIG. 6, the shielding efficiency of the electroless Cu-plated layer with a thickness of 12 μm may be improved by approximately 4 dB and 250%, and thus, may be high.

Figure 7:
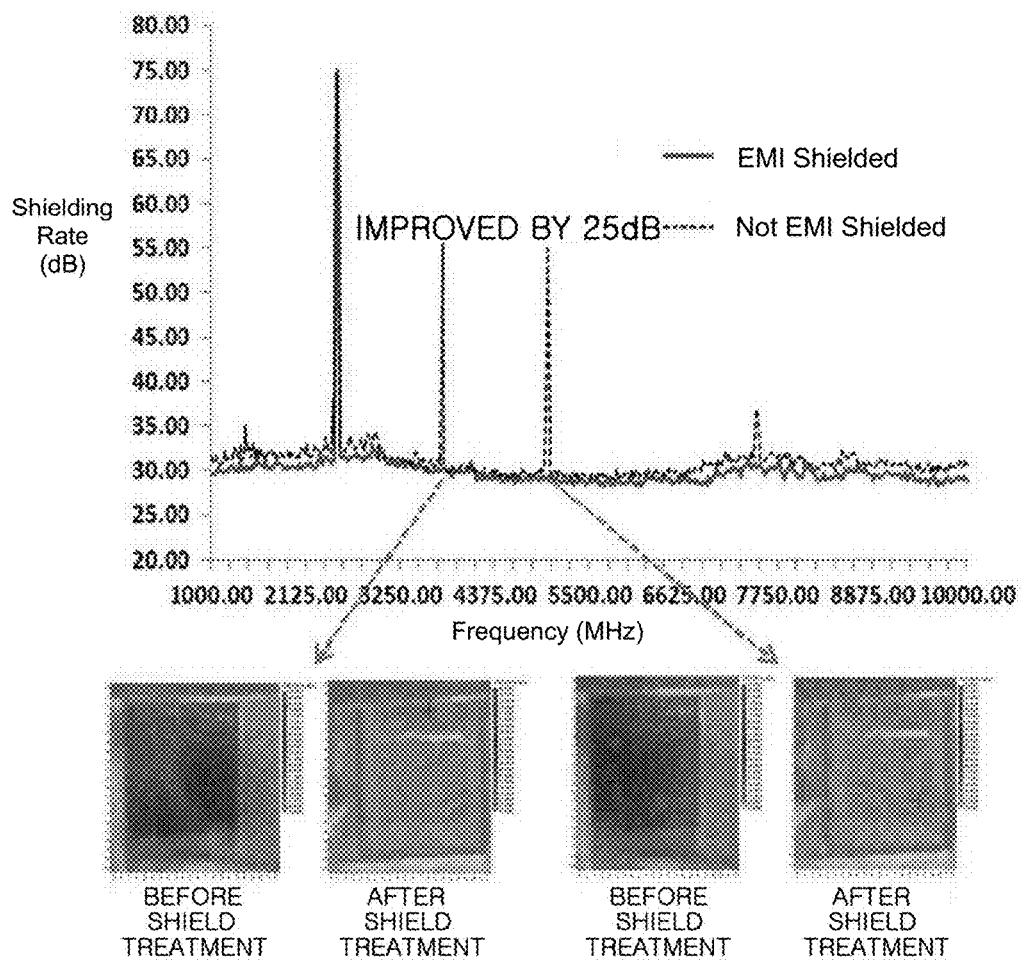
FIG. 7 is a graph that shows electromagnetic wave shielding efficiency in a higher harmonics band of 1 to 10 GHz of the shielding structure according to the embodiment of FIG. 6.

FIG. 7 is a graph that shows the electromagnetic wave shielding efficiency in a higher harmonics band of 1 to 10 GHz of the shielding structure in the embodiment described above in FIG. 6. FIG. 7 also shows images of an example, in which the metal layer is formed, compared to a comparative example, in which the metal layer is not formed, and respective shielding efficiencies for the example and the comparative example. The shielding efficiency may be improved by approximately 25 dB in the shielding structure according to the embodiment.

Embodiments disclosed herein provide a structure for shielding electromagnetic waves that may be capable of blocking EMI leakage by forming a functional layer for shielding electromagnetic waves therein and minimizing performance degradation and malfunction of electronic components by efficiently shielding various electronic devices from electromagnetic waves.

The structure for shielding electromagnetic waves may prevent a side slipping phenomenon or a blister phenomenon, in which a defect such as a blister may occur on a surface of a component, from occurring by forming a functional layer in the component using a surface treated structure and a plated layer, and may increase reliability by maximizing a shielding rate of a side portion of the structure for shielding electromagnetic waves.

According to embodiments disclosed herein, a structure for shielding electromagnetic waves may include an electromagnetic wave generating source or electromagnetic wave generator that generates electromagnetic waves, a shielding structure arranged or configured to surround the electromagnetic wave generating source, and a metal layer for shielding electromagnetic waves having surface roughness on inner surfaces of upper and side portions of the shielding structure.

According to embodiments disclosed herein, an electronic device may include a printed circuit board, an electronic component mounted on the printed circuit board and configured to generate electromagnetic waves, a shielding structure configured to surround at least a portion of the electronic component, and a metal layer formed or provided on inner surfaces of upper and side portions of the shielding structure, the metal layer having a predetermined surface roughness.

According to embodiments disclosed herein, an electromagnetic wave shield may include a shield configured to surround at least a portion of an electromagnetic wave generator that generates electromagnetic waves, a first metal layer provided on an inner surface of an upper portion of the shield having a first predetermined surface roughness, and a second metal layer provided on an inner surface of a side portion of the shield having a second predetermined surface roughness.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A structure for shielding electromagnetic waves comprising:
   an electromagnetic wave generator configured to generate electromagnetic waves;
   a shielding structure configured to surround at least a portion of the electromagnetic wave generator; and
   a metal layer provided on inner surfaces of upper and side portions of the shielding structure, the metal layer having a predetermined surface roughness,
   wherein the surface roughness of the inner surface of the upper portion of the shielding structure is in a range of 5.0 to 7.0 μm, and the surface roughness of the inner surface of the side portion of the shielding structure is in a range of 0.1 to 3.0 μm,
   wherein the surface roughness of the upper portion of the shielding structure and the surface roughness of the side portion of the shielding structure are different from each other, and
   wherein the shielding structure has an electromagnetic wave shielding efficiency in a range of 72.1~75.4 for electromagnetic waves having a frequency band of 30

MHz to 1 GHz, and the shielding structure has an electromagnetic wave shielding efficiency in a range of 28.3~33.4 for electromagnetic waves having a frequency band of 1.1 GHz~10 GHz.

2. The structure for shielding electromagnetic waves of claim 1, wherein a thickness of the metal layer is in a range of 1 to 10 μm.

3. The structure for shielding electromagnetic waves of claim 2, wherein a surface roughness is formed on the inner surfaces of the upper and side portions of the shielding structure.

4. The structure for shielding electromagnetic waves of claim 2, wherein the surface roughness is formed by patterning the metal layer.

5. The structure for shielding electromagnetic waves of claim 1, wherein the metal layer includes a first metal layer and a second metal layer provided on the first metal layer.

6. The structure for shielding electromagnetic waves of claim 5, wherein the first metal layer includes Cu, and the second metal layer includes at least one of Cu and Ni.

7. The structure for shielding electromagnetic waves of claim 1, wherein the metal layer includes at least one of an electroless Cu plated layer, an electro Cu plated layer, and electro Ni plated layer.

8. An electronic device, comprising:
a printed circuit board;
an electronic component mounted on the printed circuit board and configured to generate electromagnetic waves;
a shielding structure configured to surround at least a portion of the electronic component; and
a metal layer provided on inner surfaces of upper and side portions of the shielding structure, the metal layer having a predetermined surface roughness,
wherein the surface roughness of the inner surface of the upper portion of the shielding structure is in a range of 5.0 to 7.0 μm and the surface roughness of the inner surface of the side portion of the shielding structure is in a range of 0.1 to 3.0 μm,
wherein the surface roughness of the upper portion of the shielding structure and the surface roughness of the side portion of the shielding structure are different from each other, and
wherein the shielding structure has an electromagnetic wave shielding efficiency in a range of 72.1~75.4 for electromagnetic waves having a frequency band of 30 MHz to 1 GHz, and the shielding structure has an electromagnetic wave shielding efficiency in a range of 28.3~33.4 for electromagnetic waves having a frequency band of 1.1 GHz~10 GHz.

9. The electronic device of claim 8, wherein a thickness of the metal layer is in a range of 1 to 10 μm.

10. The electronic device of claim 8, wherein a surface roughness is formed on the inner surfaces of the upper and side portions of the shielding structure.

11. The electronic device of claim 8, wherein a surface roughness is formed by patterning the metal layer.

12. The electronic device of claim 8, wherein the metal layer includes a first metal layer and a second metal layer formed on the first metal layer.

13. An electromagnetic wave shield, comprising:
a shield configured to surround at least a portion of an electromagnetic wave generator that generates electromagnetic waves;
a first metal layer having a first predetermined surface roughness provided on an inner surface of an upper portion of the shield; and
a second metal layer having a second predetermined surface roughness provided on an inner surface of a side portion of the shield,
wherein the first predetermined surface roughness of the inner surface of the upper portion of the shield is in a range of 5.0 to 7.0 μm, and the second predetermined surface roughness of the inner surface of the side portion of the shield is in a range of 0.1 to 3.0 μm,
wherein the surface roughness of the upper portion of the shield and the surface roughness of the side portion of the shield are different from each other, and
wherein the shielding structure has an electromagnetic wave shielding efficiency in a range of 72.1~75.4 for electromagnetic waves having a frequency band of 30 MHz to 1 GHz, and the shielding structure has an electromagnetic wave shielding efficiency in a range of 28.3~33.4 for electromagnetic waves having a frequency band of 1.1 GHz~10 GHz.

14. The electromagnetic wave shield of claim 13, wherein a thickness of the first metal layer and a thickness of the second metal layer is in a range of 1 to 10 μm.

* * * * *